United States Patent [19]

Paranjpe

[11] Patent Number: 5,430,355
[45] Date of Patent: Jul. 4, 1995

[54] RF INDUCTION PLASMA SOURCE FOR PLASMA PROCESSING

[75] Inventor: Ajit P. Paranjpe, Plano, Tex.

[73] Assignee: Texas Instruments Incorporated, Dallas, Tex.

[21] Appl. No.: 100,501

[22] Filed: Jul. 30, 1993

[51] Int. Cl.$^6$ .............................................. H01J 7/24
[52] U.S. Cl. ........................ 315/111.21; 315/111.41; 315/111.51; 315/111.81; 313/231.31
[58] Field of Search ..................... 315/111.21, 111.41, 315/111.51, 111.81; 313/231.31

[56] References Cited

U.S. PATENT DOCUMENTS

| | | | |
|---|---|---|---|
| 4,948,458 | 8/1990 | Ogle | 156/643 |
| 5,036,252 | 7/1991 | Löb | 315/111.31 |
| 5,225,740 | 7/1993 | Ohkawa | |
| 5,231,334 | 7/1993 | Paranjpe | |
| 5,309,063 | 5/1994 | Singh | 315/111.51 |

FOREIGN PATENT DOCUMENTS

| | | |
|---|---|---|
| 0184812A3 | 12/1985 | European Pat. Off. |
| 0257620A2 | 8/1987 | European Pat. Off. |
| 0403418A3 | 6/1990 | European Pat. Off. |
| 0593924A1 | 9/1993 | European Pat. Off. |
| 3120359 | 5/1991 | Japan |
| 4147969 | 5/1992 | Japan |
| WO92/14258 | 8/1992 | WIPO |

OTHER PUBLICATIONS

R. W. Boswell, "Very efficient plasma generation by whistler waves near the lower hybrid frequency," Plasma Physics, vol. 26, pp. 1147, 1984.
R. W. Boswell and R. K. Porteous, "Large volume high density rf inductively coupled plasma", App. Phys. Lett., vol. 50, p. 1130, 1987.
R. W. Boswell, A. J. Perry and M. Emami, "Multipole confined diffusion plasma produced by 13.56 MHz electrodeless source", J. Vac. Sci. Technol., A, vol. 7, p. 3345, 1989.
F. F. Chen, "Experiments on helicon plasma sources", J. Vac. Sci. Technol. A, vol. 10, pp. 1389–1401, 1992.
J. M. Cook, D. E. Ibbotson, and D. L. Flamm, "Application of a low-pressure radio frequency discharge source to polysilicon gate etching", J. Vac. Sci. Technol. B, vol. 8, pp. 1–3, 1990.
T. Shirakawa, H. Toyoda, and H. Sugai, "RF plasma production at ultralow pressures with surface magnetic confinement", Jap. J. App. Phys., vol. 29, pp. L1015-L1018, 1990.
J. Hopwood, C. R. Guarnieri, S. J. Whitehair, and J. J. Cuomo, "Electromagnetic fields in a radio-frequency induction plasma", J. Vac. Sci. Technol., A, vol 11, pp. 147–151, 1993.
A. J. Perry, D. Vender, and R. W. Boswell, "The application of the helicon source to plasma processing", J. Vac. Sci. Technol., B, vol. 9, pp. 310–317, 1991.

Primary Examiner—Robert J. Pascal
Assistant Examiner—Reginald A. Ratliff
Attorney, Agent, or Firm—Douglas A. Sorensen; Richard L. Donaldson; William E. Hiller

[57] ABSTRACT

Plasma generator (10) includes chamber (14) for containing the plasma source and a plurality of coils (12) located inside of chamber (14). Located external to chamber (14) are a plurality of permanent multipolar magnets (34) operable to establish a magnetic field in the plasma source along the surface of chamber (14) and a set of electromagnets (36) located outside of chamber (14), which define a preferred propagation direction for a whistler wave in chamber (14). Coils (12) resonantly inductive couple RF power to the whistler wave so as to transfer a sufficient amount of energy to the plasma source to induce a plasma state in the plasma source. Coils (12) also generate time varying electromagnetic fields which also sustain the plasma state in the plasma source.

52 Claims, 4 Drawing Sheets

RF INDUCTION PLASMA SOURCE FOR PLASMA PROCESSING

CROSS-REFERENCE TO RELATED APPLICATIONS

This application is related to application Ser. No. 07/868,818 filed Apr. 15, 1992, by Ajit Pramod Paranjpe, and assigned to Texas Instruments Incorporated, entitled "Plasma Source and Method of Manufacturing", (TI-15886) now U.S. Pat. No. 5,231,334, issued Jul. 27, 1993.

TECHNICAL FIELD OF THE INVENTION

This invention relates in general to the field of generating plasma by radio frequency induction, and more particularly to an improved method and apparatus for generating plasma by radio frequency resonant induction coupling.

BACKGROUND OF THE INVENTION

Inductively coupled plasmas ("ICPs") generated with radio frequency ("RF") waves having a frequency generally between 1 MHz and 100 MHz are capable of providing charged particle (electron and ion) concentrations in excess of $10^{11} cm^{-3}$ and ion currents to wafer substrates in excess of 5 mA/cm². The ICP source is thus competitive with electron cyclotron resonance ("ECR") plasma sources for semiconductor manufacturing processes requiring plasma generation. Semiconductor manufacturing processes that make use of plasmas include dry etching, plasma enhanced deposition, dry cleaning of wafers, and applications requiring the generation of ultraviolet (UV) light.

Inductively coupled RF plasma sources have advantages over both capacitively coupled RF plasma sources and ECR plasma sources. In contrast to capacitively coupled RF plasmas, inductively coupled RF plasmas have substantially lower intrinsic plasma potentials (<50 V) and achieve a substantially higher ionization efficiency (>5%). Also, the intrinsic plasma potential is relatively independent of the RF power. The low intrinsic plasma potential is useful in applications where high ion energies cannot be tolerated, such as in dry etching where high ion energies can damage the devices on the wafer.

In ECR plasma sources, the plasma ions are produced by electron bombardment in a discharge chamber, and directed towards the surface using magnetic and/or electric fields. As in the case of ECR systems, the ion energy of an inductively coupled RF plasma can be varied independently of the plasma density by biasing the integrated circuit wafer with a separate RF or DC power supply. For an ECR plasma source, the pressure at which the plasma may be effectively generated is also a concern. An ECR source is most effective at pressures below 1 mTorr, which is too low for most semiconductor process applications. The ICP source, however, has the advantage of operating over a pressure range that is more compatible with semiconductor process requirements (1 mTorr to 50 mTorr). Since the operating pressure is higher, the pumping requirements for a given gas flow rate are more modest for the ICP source. In addition, the ICP source can provide a larger diameter (15 cm to 30 cm), homogeneous plasma, in a compact design, and at substantially lower cost than an ECR source.

One type of plasma source employing RF induction coupling couples energy into the plasma through whistler or helicon waves. This type of generator is called a helicon plasma source. In the presence of a magnetic field ranging from 100 G to 1 kG directed along the axis of the source, a whistler wave can be excited by applying an RF voltage to a loop antenna located around the source cavity. Although these axial magnetic fields are generally weaker than the magnetic fields employed in ECR sources, the plasma is non-uniform across the diameter of the source. Thus, a wafer undergoing a plasma process must be located away or "downstream" of the source, in a region where the plasma is sufficiently uniform. This requires the input power of the source to be increased to maintain a sufficient plasma density (i.e., electron and ion concentration) at the downstream position. Also, large solenoidal coils are required to generate the axial magnetic field. These features increase source cost and complexity.

A second type of plasma source differs from the generic whistler wave or helicon source by omitting the axial magnetic field. The wafer undergoing a plasma process can therefore be placed within the plasma generation region. Even though the peak plasma densities ($5 \times 10^{11} cm^{-3}$) for such a source are about an order of magnitude lower than those for the whistler wave source, the proximity of the wafer to the plasma generation region in the source ensures that processing rates are comparable. Wafer etch rates of over 1 $\mu$m/min are possible for many materials of interest. This source is simpler, more compact, and cheaper than the helicon plasma source.

One version of this type of induction plasma source employs a multi-turn pancake coil located along the top surface of a cylindrical vacuum chamber. A quartz vacuum window, typically 0.5 in. thick, isolates the coil from the chamber. When the coil is powered by an RF source, large currents circulate in the coils. These currents induce intense electric fields inside the chamber that sustain the plasma state. The time-varying magnetic and electric fields generated by the pancake coil are proportional to the coil current, and increase in proportion to the square of the number of coil turns and the coil diameter. The uniformity of the induced electric field from a pancake coil improves with increasing coil diameter and the number of coil turns. However, the inductance of the coil is also proportional to the square of the number of coil turns. This implies that the voltage drop across the coil increases with an increasing number of coil turns for a fixed coil current. As an example, the voltage drop across a 5 $\mu$H coil for an RMS current of 20 A at 13.56 MHz is 8.5 kV. Such a high voltage is a hazard and results in capacitive energy coupling between the coil and the plasma. Capacitive coupling is undesirable because the intrinsic plasma potential increases dramatically if a significant amount of energy is transferred via capacitive coupling. These issues constrain the number of coil turns to about three in these RF plasma sources with multi-turn pancake coils located along the top surface of the source.

SUMMARY OF THE INVENTION

Therefore a need has arisen for an RF plasma source that combines the advantages of the helicon plasma source and the ICP plasma source, minimizes the number of system components, efficiently uses output power, provides good plasma uniformity, and maintains coil voltages at safe levels. In accordance with the present invention, an apparatus and method for generating a plasma are provided which substantially eliminate or reduce disadvantages and problems associated with existing plasma sources.

The present invention is an inductively coupled plasma (ICP) source comprising an apparatus for generating a plasma. The source includes a vacuum chamber for containing the plasma. Outside the chamber may be included a plurality of permanent multipolar magnets which can be used to establish a cusp magnetic field to reduce plasma losses to the chamber wall, enhance plasma density, and extend operation of the plasma source to lower pressures. The source includes at least one set of electromagnets located outside the chamber for generating a variable static magnetic field defining a preferred propagation direction for the whistler wave. Also included are coils that serve as an antenna for resonant inductive coupling of RF power to generate and excite a whistler wave. The excited whistler wave transfers sufficient energy to induce and sustain a plasma within the process gases. The coil also generates time varying standing wave electromagnetic fields. These fields enhance the plasma density in the plasma source. The at least one coil is located either inside or external to the chamber of the plasma source of the present invention.

More specifically, to achieve whistler wave coupling the frequency of the RF power used to excite the whistler wave should be chosen to be between the ion and electron cyclotron frequencies of the process gases, and the cyclotron frequency should be less than the electron plasma frequency of the process gases. The RF power source, in the method and apparatus of the present invention, can provide either transverse electromagnetic (TE) mode waves, transverse magnetic (TM) mode waves, or mixed TE and TM mode waves for establishing the whistler wave.

A technical advantage of the present invention is that it can be integrated into existing semiconductor processing equipment. For example, dry etch chambers which require a plasma to perform etching can be fitted with the plasma source of the present invention. An integrated dry etch/plasma source chamber provides enhanced etch capabilities over wet-etching systems.

An important technical advantage of the disclosed invention is that the coil configuration can generate more intense fields when compared to single turn coils. The multiple turn coil configuration of the present invention gives the technical advantage of effectively providing a range of antenna lengths thereby improving resonant inductive coupling efficiency over a range of plasma discharge conditions. Off-resonance induction coupling is not very efficient; thus, providing antennas of varying lengths can widen the operating range of the plasma generator. Also, antennas of different lengths can lead to the technical advantage of multi-mode operation and more homogeneous plasmas.

Another technical advantage is that the electromagnetic fields generated in the chamber of the plasma source of the present invention are uniform and concentrated in the chamber. The present invention provides the technical advantage of containing the electromagnetic field generated entirely within the process chamber. This eliminates eddy current heating of metal surfaces outside the chamber, and leads to more efficient plasma generation. Also, the multi-polar magnetic confinement provided with the coils enhances plasma densities for pressures less than 50 mTorr.

Another technical advantage of the present invention is that if the plasma discharge is operated in a regime in which resonant induction coupling to the whistler wave does not occur, then the electromagnetic fields induced by the multiple close-packed coils sustain the plasma through inductive coupling only. Thus, it should be possible to obtain and maintain a plasma in the plasma source of the present invention under conditions where resonant induction coupling is not efficient nor possible.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiments of the present invention and their advantages are best understood by referring to FIGS. 1–8, like numerals being used for like and corresponding parts of the various drawings.

Figure 1:
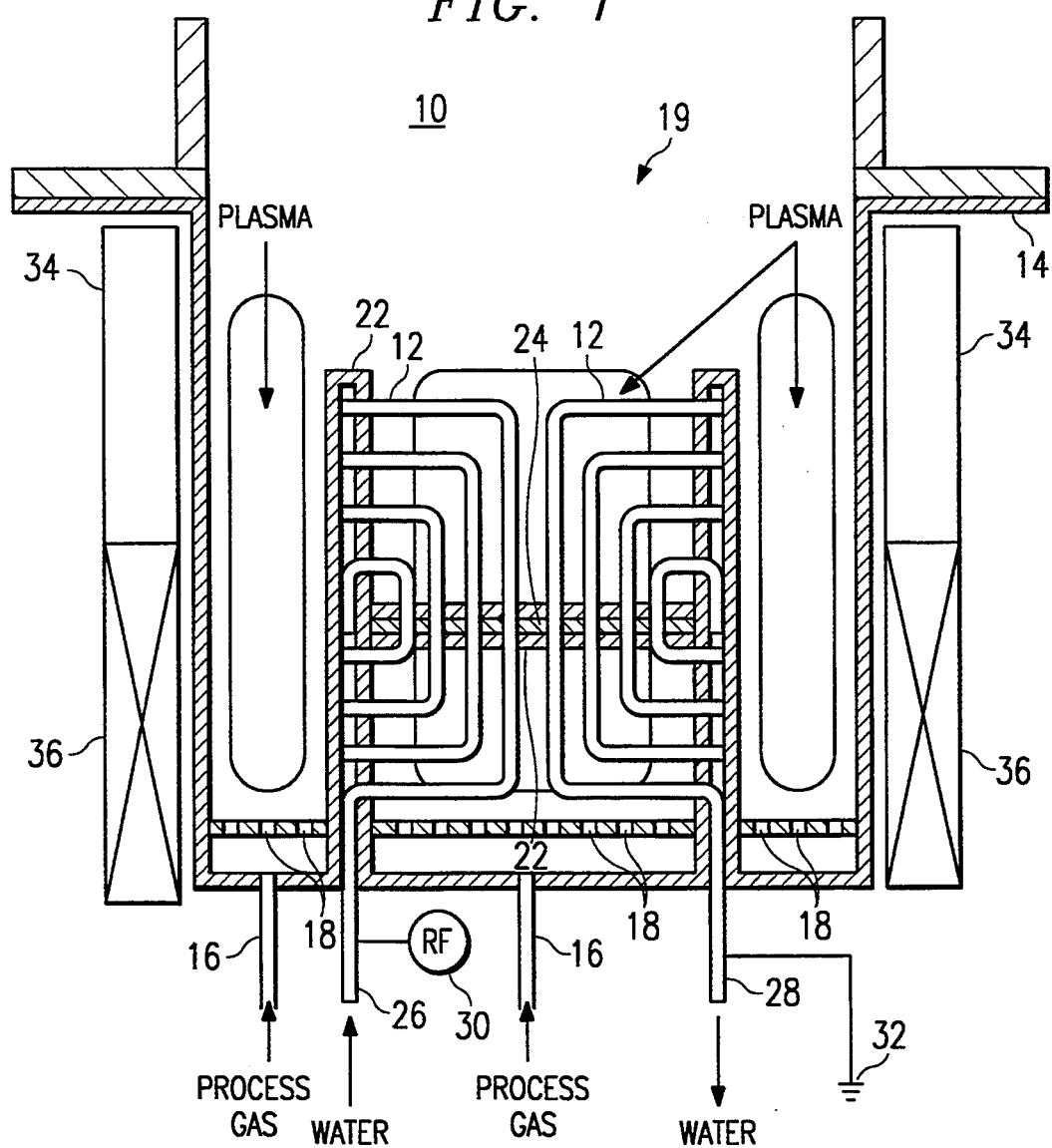
FIG. 1 depicts a partially cross-sectional, partially schematic diagram of the plasma source with coils located inside the chamber.

FIG. 1 depicts a partially cross-sectional, partially schematic diagram of plasma source 10 employing coils 12 to inductively couple RF power to process gases to induce a plasma state in the process gases. Plasma source 10 includes chamber 14 which is typically made of a suitable dielectric material such as quartz so as to better contain the plasma. Chamber 14 is also typically vacuum sealed. Chamber 14 has inlet 16 for introducing the process gases into chamber 14. Inlet apertures 18 allow the process gases to enter chamber 14 at a uniform controlled rate. Once the plasma state is achieved in the process gases, the plasma is discharged from chamber 14 through an opening represented in FIG. 1 by end 19. Plasma source 10 of FIG. 1 can be attached to any suitable semiconductor processing chamber requiring a plasma for the process. Wafer etching and deposition chambers are exemplary of semiconductor processing chambers that plasma source 10 could be attached to.

Chamber 14 may have within it a plurality of coils 12. Coils 12 are a series of loop antennas arranged concentrically with the coil arrangement and shaped to match the contour of chamber 14. Coils 12 may be made of any suitable RF conductive material. Copper, aluminum, or copper clad tubing of quarter-inch diameter have been shown to be suitable materials for the manufacture of coils 12. In the embodiment of FIG. 1 coils 12 are located inside of chamber 14 and are encased in dielectric coating 22 to prevent their contamination. Quartz and epoxy encapsulants may be suitable materials for dielectric coating 22. Coils 12 may be coupled together by connecting line 24 running through the center of chamber 14. Connecting line 24 is likewise encased in dielectric coating 22. Coils 12 may also be arranged with water inlet 26 and water outlet 28. Water can be pumped through coils 12 and connecting line 24 in order to maintain the temperature of coils 12 and line 24 below the temperature at which the coils or coating may be damaged. Coils 12 are also coupled to RF power source 30 and ground 32. An intervening matching network (not explicitly shown) is required to apply the RF power (1 MHz to 100 MHz) from RF power source 30 to coils 12. In the embodiment of FIG. 1, RF power source 30 provides RF energy in the form of transverse electromagnetic (TE) mode waves.

Figure 2:
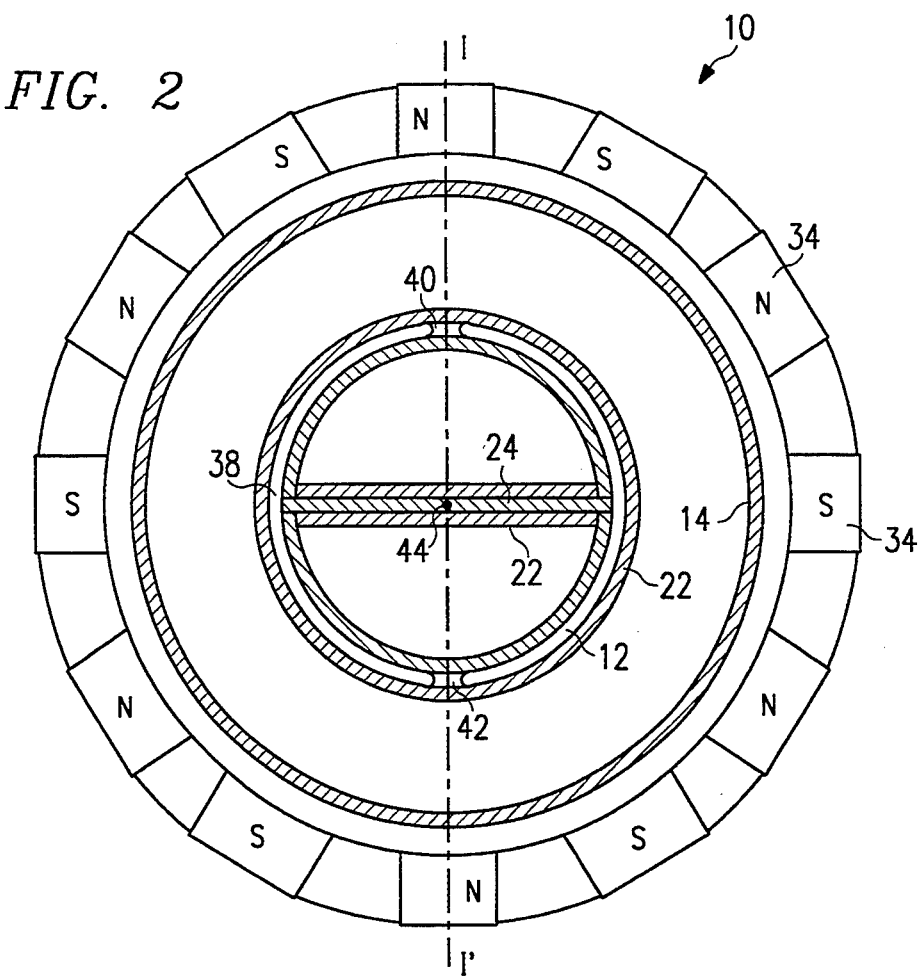
FIG. 2 depicts a top plan view of the plasma source in FIG. 1.

Outside of chamber 14 may be included multiple permanent magnets 34 arranged around the entire circumference of chamber 14 with like polarity magnets facing each other, see FIG. 2. It should be noted that the permanent magnets may be omitted without affecting the inventive concepts of the present invention. Permanent magnets establishing a magnetic field of 100–500 gauss at the surface of the chamber have been found to be suitable. In the embodiment of plasma source 10 depicted in FIG. 1, a single set of electromagnets 36 are located outside of chamber 14. Solenoidal electromagnets establishing an electromagnetic field of 100–1000 gauss at the center of chamber 14 have been found to be suitable. It is envisioned that the number and arrangement of permanent magnets 34 and solenoidal electromagnets 36 can be varied without affecting the inventive concepts of the present invention.

FIG. 2 depicts a top plan view of plasma source 10 of FIG. 1. As can be seen in this view, coils 12 are located inside of chamber 14 and are encased with dielectric coating 22. Coils 12, while being formed concentrically in a planar view (SEE FIG. 4), are also contoured to match the circular shape of chamber 14. Therefore, the top plan view of FIG. 2 shows coils 12 in the form of circle 38. Coils 12 are in fact separated by spaces 40 and 42. While the embodiment of FIGS. 1 and 2 is shown with two coils 12, it is understood that the number of coils can be varied without affecting the inventive concepts of the present invention.

In operation of plasma source 10 depicted in FIGS. 1 and 2, a process gas, e.g. argon or sulphur hexaflouride, are introduced into chamber 14 through inlet 16 and inlet apertures 18. The arrangement of permanent magnets 34 with magnets of alternating polarity placed next to each other establish a cusp magnetic field along the surface of chamber 14 which aids in confinement of the plasma. Electromagnets 36 generate a variable static magnetic field which defines the propagation direction for the whistler wave generated by coils 12. Additional sets of electromagnets 36 can be used to improve the uniformity of the axial magnetic field, although only one set is shown in this embodiment. It may be necessary to use three or more electromagnets to improve plasma uniformity.

In resonant induction plasma generators, the whistler wave in the cavity is excited by resonant coupling when the length of an antenna located in or around the cavity matches one-half the wavelength of the whistler wave. To ensure that the dominant coupling of RF energy is to the whistler wave through resonant induction, the optimum length of the antenna required for maximum coupling is a function of the conditions in the plasma source. The wavelength of the whistler wave can be represented by Equation (1):

$$\lambda(cm) \approx 5 \times 10^9 \left(\frac{B_0}{n_e f}\right)^{1/2} \quad (1)$$

where: $B_0$ is the magnetic field in gauss;
$n_e$ is the electron concentration in $1/cm^3$; and
$f$ is the frequency in Hz.

Thus, for an antenna of fixed length, resonant induction and excitation of the whistler wave leading to plasma generation will occur only if the variables in Equation (1) are such that the wavelength of the whistler wave is equal to one-half of the length of the antenna in the cavity. Since the wavelength $\delta$ of the whistler wave is dependent on the magnetic field $B_0$, the electron concentration $n_e$, and frequency $f$ of the wave in the chamber, it will not always be possible to achieve and maintain a plasma state in the process gases with a single loop antenna.

In the embodiment of the present invention depicted in FIGS. 1 and 2, as the magnetic field $B_0$, electron concentration $n_e$, and frequency $f$ change in chamber 14, thereby affecting the wavelength $\delta$ of the whistler wave, coils 12 provide the multiple antenna lengths necessary to match one-half the changing wavelength $\delta$ of the whistler wave. Coils 12, therefore, effectively provide a range of antenna lengths making it possible to achieve resonant induction excitation of the whistler wave thereby improving coupling efficiency over a range of plasma conditions.

Coils 12 also induce intense time-varying electromagnetic fields in chamber 14. Once the time-varying electromagnetic fields reach the necessary threshold, the process gases are ionized and a plasma is established in chamber 14. The antennas of varying lengths, e.g. coils, can also lead to multi-mode whistler wave generation and a more homogeneous plasma. Furthermore, in operation of plasma source 10 depicted in FIGS. 1 and 2, if the discharge is operated in a region in which resonant induction does not occur, then the intense time-varying electromagnetic fields inside chamber 14 generated by multiple coils 12 will sustain the plasma. Thus, it is possible to maintain the plasma state in the process gases even under conditions that do not support whistler wave generation and resonant induction. Also, the magnetic field B configuration due to coils 12 has large tangential and radial components, that are desirable for exciting the whistler mode.

Figure 3:
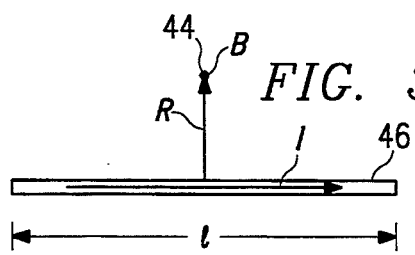
FIG. 3 depicts the magnetic field due to current in a length of wire.

Also identified in FIG. 2 is point 44 which will be used as a reference to discuss the fields in plasma source 10. Point 44 should be viewed as any unfixed point along plane 1—1' above or below connecting line 24, and within the upper and lower boundaries of coils 12. The magnetic field B at point 44 on plane 1—1' due to the current in the length l of wire 46 at a distance R as depicted in FIG. 3 is given by Equation (2):

$$B = \frac{\mu_0 I}{2\pi R} \frac{l}{(l^2 + 4R^2)^{1/2}} \quad (2)$$

where: I is the current in wire 46
R is the distance from wire 46
l is the length of wire 46

$\mu_o$ is the permeability of the medium in which the wave is traveling

Magnetic field B should be viewed as traveling on a circular path centered around wire 46.

Figure 4:
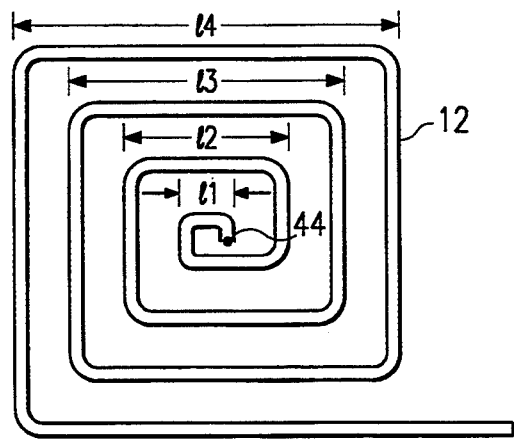
FIG. 4 depicts a coil consisting of four loops.

Each coil may be treated as a number of segments of wire attached end to end. This concept is more clearly illustrated in FIG. 4. In coil 12 consisting of four loops as shown in FIG. 4, the coil is four lengths of wire identified as $l_1$, $l_2$, $l_3$, and $l_4$. Therefore, the magnetic field at point 44 in accordance with Equation (1) is given by Equation (3):

$$B = \frac{\mu_o I}{2\pi} \left[ \Sigma \frac{l_i}{\frac{l_i}{2}\left(l_i^2 + 4\frac{l_i^2}{4}\right)^{1/2}} \right] \quad (3)$$

giving, $$B = \frac{\mu_o I}{\sqrt{2}\,\pi} \Sigma \frac{1}{l_i} \quad (4)$$

If $l_1=1''$, $l_2=3''$, $l_3=5''$, $l_4=7''$, $\mu_o=4\pi\times10^{-7}$ H/m, and if the current I in coil 12 is 40 amps, then magnetic field B in chamber 14 is 7.5 gauss.

Figure 5:
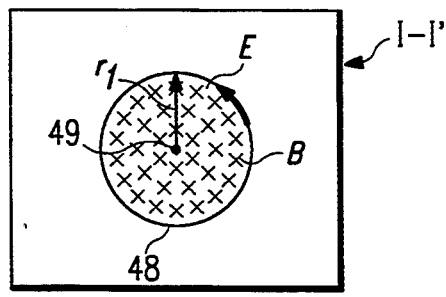
FIG. 5 depicts a cross-sectional view of FIG. 2 along plan I—I'.

The magnetic field B from coils 12 in chamber 14 induces a time-varying electric field E. It is possible to estimate the time varying electric field E within chamber 14. Consider FIG. 5 depicting a closed loop 48 along plan I—I' within the boundaries of coils 12 in FIG. 2. The relationship between the electric field E and magnetic field B along plan I—I' of FIG. 2 can be depicted as shown in FIG. 5. Magnetic field B within closed loop 48 at point 49 is shown transecting plan I—I'. The time varying electric field E generated is tangential to the magnetic field B and varies according to the distance $r_1$ from point 49. The time varying electric field E can be represented by Equations (5):

$$E = \frac{\omega B r_1}{2} \quad (5)$$

where: $\omega$ is the radian frequency of the signal;
B is the magnetic field in gauss; and
r is the distance in inches from point 49.

For $\omega=2\pi f=8.5\times10^2$ radians per second; B=7.5 gauss and $r_1=1$ inch, then electric field E is 8 volts per centimeter.

This value of electric field E is an underestimation, since the electric field is known to be more intense along the inner surface of chamber 14 compared to the center of chamber 14. On average, it has been determined that the electric field E is likely to be three times as intense along the inner surface of chamber 14 over that at the center of chamber 14. Thus, the electric field E is approximately 25 volts per centimeter along the inner surface of chamber 14.

When using Argon as the process gas, the minimum electric field E required to induce a plasma state in Argon is represented by Equation (6):

$$E/N = 4 \times 10^{-16} \text{ Vcm}^2 \text{ @ 50 mTorr} \quad (6)$$

where: N is the gas density of Argon, and for $N=1.7\times10^{15}/\text{cm}^3$ @ 50 mTorr
therefore, $E=(E//N)N=0.67$ V/cm
Therefore, applying Equation (6) the electric field E required to induce a plasma state in the example above is 0.67 volts per centimeter. Since it has been shown above that a current of 40 amps in coil 12 depicted in FIG. 4 results in a magnetic field B of 7.5 gauss, which in turn, from Equation (5), results in an electric field E of 8 volts per centimer, then the current required to generate an electric field E of 0.67 V/cm can be calculated, ([(40 amps)(0.67 V/cm)]/(8 V/cm)). Thus, it is possible to sustain an RF discharge in Argon with a minimum coil current of approximately 3 amps.

For process gas sulphur hexaflouride ($SF_6$), the minimum electric field E required to induce a plasma state can be represented by Equation (7):

$$E/N = 4 \times 10^{-15} \text{ Vcm}^2 \text{ @ 50 mTorr} \quad (7)$$

where: N is the gas density of sulphur hexaflouride, and, $N=1.7\times10^{15}/\text{cm}^3$ @ 50 mTorr therefore:

$N=(E/N)(N)=6.7$ V/cm

Therefore, applying Equation (7), the electric field E required to induce a plasma state in sulphur hexaflouride is 6.7 volts per centimeter. Thus, the minimum coil current required to sustain an RF discharge in sulphur hexaflouride is approximately 33 amps, ([(40 amps)(4.7 V/cm)]/(8 V/cm)).

The plasma density $n_e$ achievable under these conditions can also be calculated. Assume the power provided by RF power source 30 is 500 watts. It is known that the portion of the power used in ionization of the process gas, i.e. ionization efficiency is 0.4, for an electric field E equal to 8 volts per centimeter. The ionization threshold for Argon is 16 electronvolts, therefore the volumetric ionization rate can be represented by Equations (8) and (9):

$$\text{Ionization Rate} = \quad (8)$$

$$\frac{\text{Total Ionization Rate}}{\text{Volume of Plasma source}} = 6.2 \times 10^{15}/\text{cm}^3 \cdot s$$

where, $$\text{Total Ionization Rate} = \quad (9)$$

$$\frac{\text{Power} \times \text{Ionization Efficiency}}{\text{Ionization Threshold}} = 7.8 \times 10^{19}/s$$

The loss rate of the plasma can be represented by Equation (10):

$$\frac{D_a n_e}{\Lambda^2} = 2.7 \times 10^3 n_e/\text{cm}^3 \cdot s \quad (10)$$

where: $D_e$ is the diffusion coefficient for the electrons and ions, and
$D_e = 7 \times 10^4 \text{cm}^2/\text{s}$ @ 50 mTorr
$\Lambda$ $\Lambda$ is the scale length for diffusion, and
$\Lambda = 5$ cm Therefore, the plasma density $n_e$ is $2\times10^{12}/\text{cm}^3$. It is recognized that the actual electron density is likely to be higher since an underestimation of the electric field E has been used.

The embodiment shown in FIGS. 1 and 2 makes use of two coils 12 connected together by connecting line 24. It is understood that a single coil 12 providing circle 38 without spaces 40 and 42 as well as a larger number of coils appropriately shaped may be used without departing from the inventive concepts of the present invention. Additionally, the shape of the coils need not be square as depicted in FIG. 4, but can, for example, be rectangular. It is noted that a square shaped coil is likely to increase the magnetic field within the cylinder bounded by the square coil whereas a rectangular shaped coil is likely to produce a magnetic field B that is independent of axial location along a chamber axis. The magnetic field B which is independent of axial location along a chamber axis is better for achieving resonant induction coupling.

Figure 6:
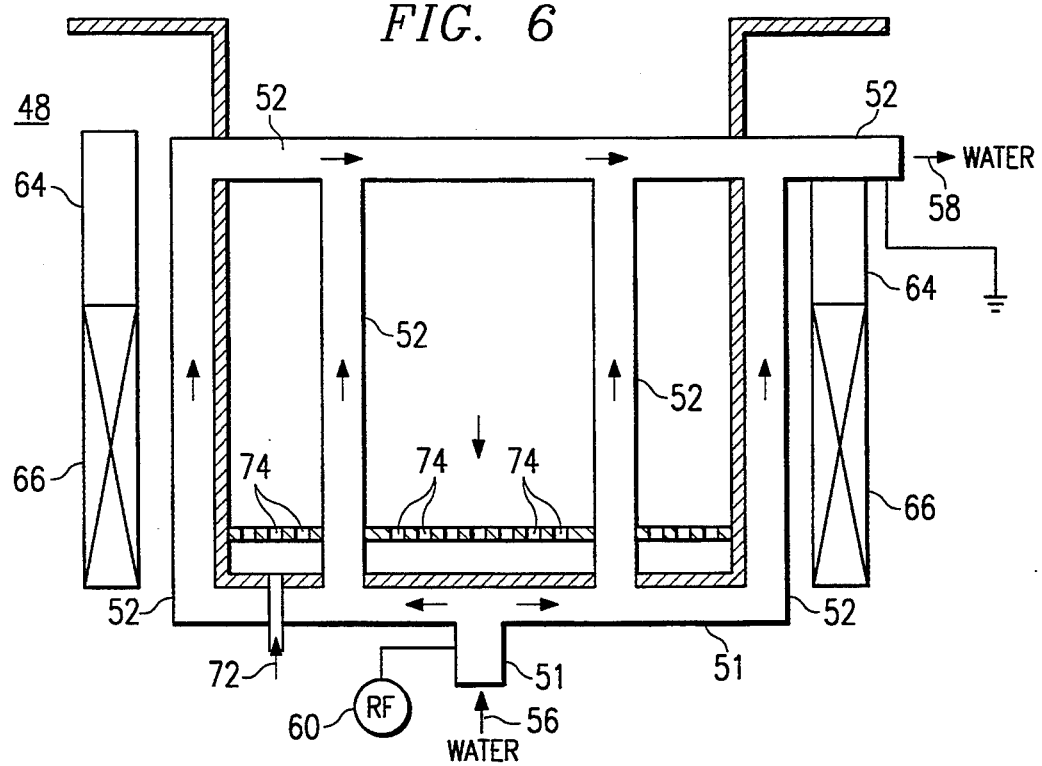
FIG. 6 depicts a partially cross-sectional, partially schematic diagram of a second embodiment of the plasma source with the coils located outside the source chamber.

In another embodiment shown in FIG. 6, plasma source 48 of the present invention also uses coils to excite a wave to induce a plasma state in process gases. Plasma source 48 has chamber 50 for containing the plasma. Chamber 50 is generally made of a dielectric material such as quartz to better contain the plasma. Plasma source 48 also includes a plurality of coils of similar construction to those depicted in FIGS. 1 and 2. Coil section 51 runs across and outside the bottom of chamber 50. Coil sections 52 run along the sidewalls of chamber 50, across the top, and back out of chamber 50.

Coil 51 is coupled to water inlet 56, and coil 52 is coupled to water outlet 58. Water is pumped through the coils in order to cool the coils to prevent heat damage. Also connected to coil 51 is RF power source 60, and coil 52 is connected to ground 62. An intervening matching network (not explicitly shown) is required to apply RF power from RF power source 60 to coil 51. RF power source 60 provides transverse magnetic (TM) mode waves. The arrows on FIG. 6 show both the water flow and current direction in the coils.

Located outside both chamber 50 and coils 51 and 52 are permanent magnets 64 and electromagnets 66. The arrangement and number of permanent magnets 64 and electromagnets 66 in the embodiment of FIG. 6 is consistent with those of FIGS. 1 and 2.

The process gases are introduced into source 48 through inlet 72 and through inlet apertures 74. Inlet apertures 74 provide for a uniform entry of the process gases into chamber 50.

Figure 7:
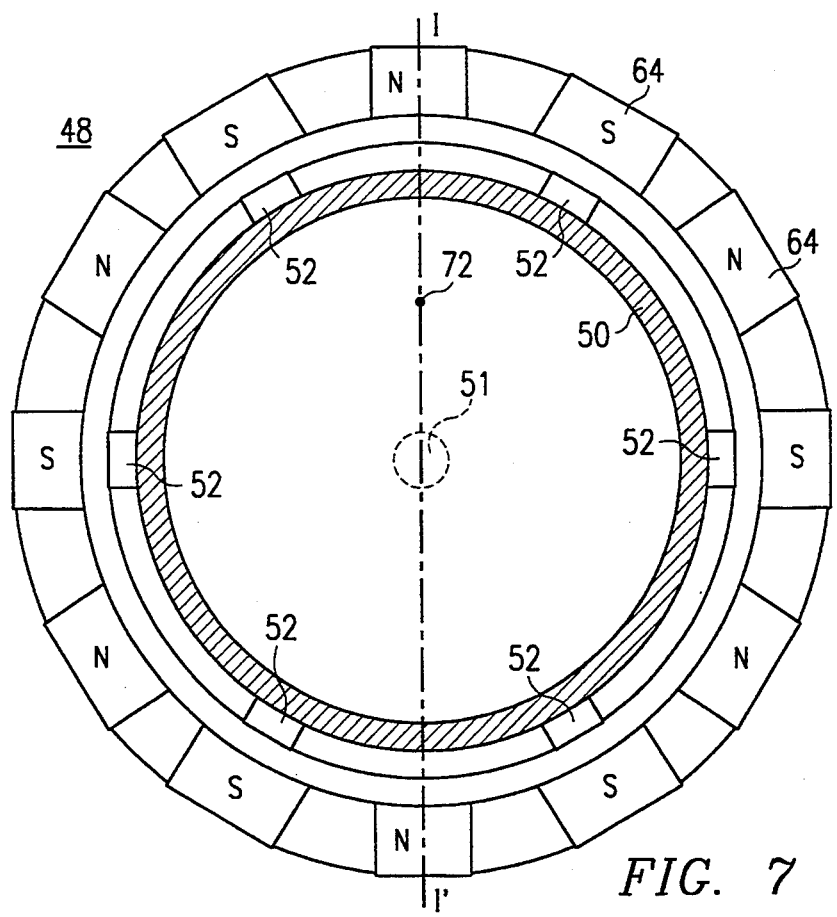
FIG. 7 depicts a top-down plan view of the plasma source depicted in FIG. 6.

FIG. 7 depicts a top plan view of plasma source 48. As depicted in FIG. 7, coils 52 are located external to chamber 50, but internal to magnets 64 and 66.

In operation, plasma source 48 depicted in FIGS. 6 and 7 provides for an inductively coupled RF plasma with coils 52 located entirely outside chamber 50 and the magnetic field B confined entirely to the chamber. The magnetic field B at point 72 along plan I—I' in FIG. 7 is represented by Equation (12):

$$B = \frac{\mu_o I}{2\pi r} \quad (10)$$

where: $\mu_o$ is the permeability of the medium in which the wave is travelling;
I is the current in the wire; and
r is the distance from the wire.

For r=2 inches and I=40 amps, then B=1.5 gauss. Plasma source 48 depicted in FIGS. 6 and 7 can therefore provide a magnetic field sufficient to induce the time-varying electric fields used to induce the plasma state in the process gases. However, the current required to sustain an equivalent field is higher than that required in plasma source 10 of FIGS. 1 and 2.

Figure 8:
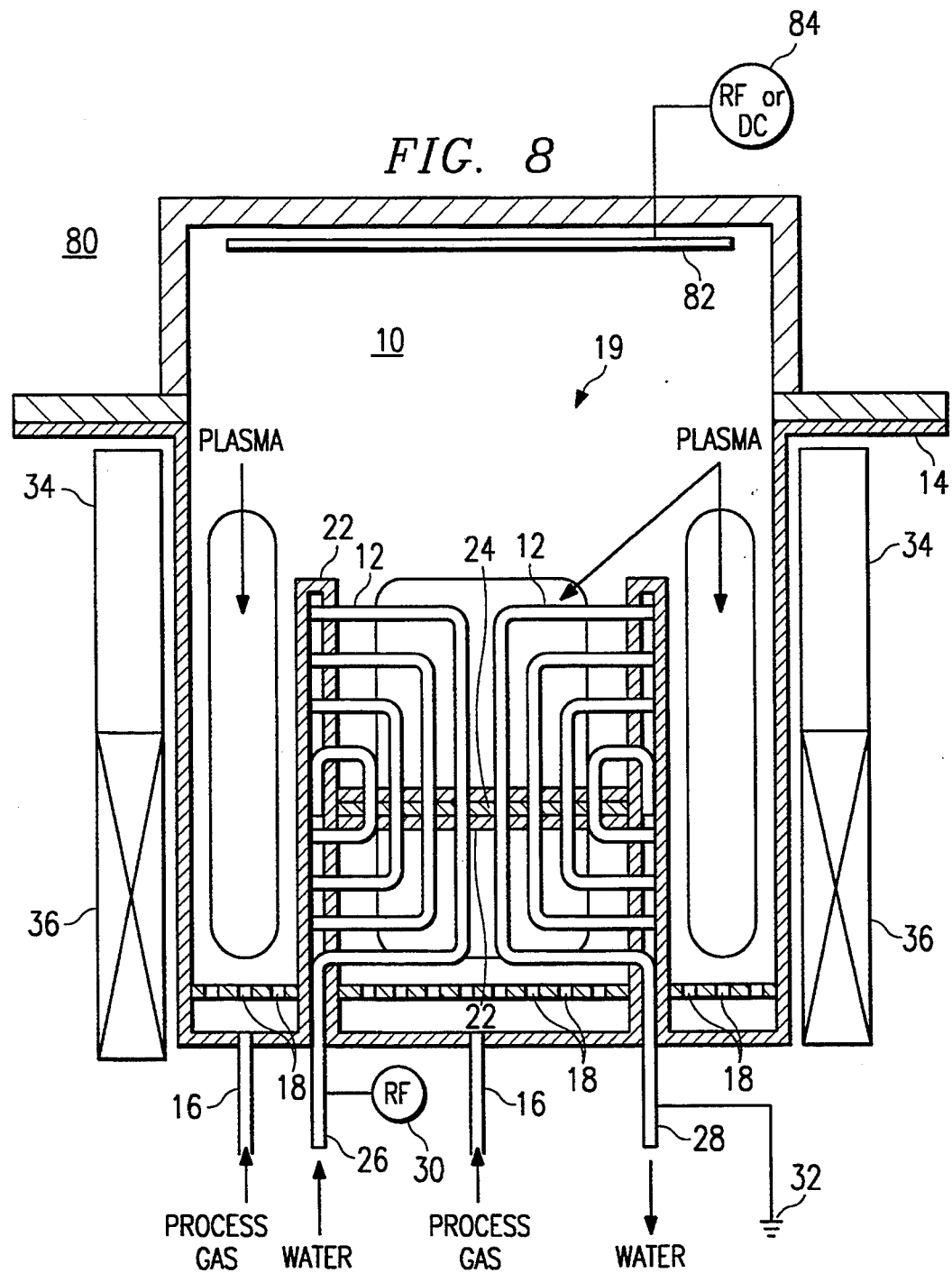
FIG. 8 depicts a partially cross-sectional, partially schematic diagram of the plasma source of FIG. 1 integrated into a semiconductor processing chamber.

FIG. 8 depicts dry etch processing chamber 80 incorporating plasma source 10 of FIG. 1. Inside of chamber 80 is semiconductor wafer 82 upon which dry etching with the plasma of plasma source 10 is performed. In the embodiment of FIG. 8, the operation of generator 10 is as described above with the electromagnets 36 arranged to cause the plasma to strike the surface of wafer 82 so as to perform etching. Depicted in FIG. 8 is RF or DC source 84 which is used to bias wafer 82. Biasing wafer 82 with RF or DC source 84 allows for independently varying the ion energy of the plasma in chamber 80. It is noted that the orientation of wafer 82 to generator 10 can be reversed without affecting the inventive concept. Also, source 10 could be replaced with source 48 of FIG. 6, since source 48 can also induce the necessary plasma to etch wafer 82 in chamber 80.

The coils depicted in FIGS. 1, 2, 4, 6, 7 and 8 are understood not to be the only configurations possible under the teachings of the present invention. Coils with any polygonal shape or circular, semicircular, elliptical shape along the outermost coil are within the teachings of the present invention. Also, it is noted that the coils of FIGS. 1, 2, 4, 6, 7, and 8 can be segmented with capacitors installed between adjacent segments to reduce the impedance of the coil, as taught by U.S. patent application Ser. No. 07/868818 filed Apr. 15, 1992 and assigned to Texas Instruments Incorporated, entitled "Plasma Source and Method of Manufacturing," expressly incorporated by reference herein.

Therefore, a novel design for an RF excited inductively coupled plasma source has been described. Compared to existing sources, this source is capable of generating large volume, spatially uniform, dense plasmas over a wide range of operating conditions. The characteristics of the plasma include large ion fluxes and low intrinsic plasma potentials. Such a source is suitable for applications such as, for example, in dry etching, plasma enhanced deposition, and ultraviolet (UV) generation.

Although the present invention has been described in detail, it should be understood that various changes, substitutions and alterations can be made hereto without departing from the spirit and scope of the invention as defined by the appended claims.

What is claimed is:

1. A plasma source for generating a plasma, comprising:
a chamber operable to confine the plasma and process gases; a coil operable to generate a whistler wave in said chamber, said coil comprising a plurality of coils located inside of said chamber and positioned substantially parallel to sidewalls of said chamber, said plurality of coils shaped to match the contour of said chamber and connected by a connecting coil traversing a vertical axis of said chamber;
at least one set of electromagnets located outside of said chamber, said electromagnets operable to define a preferred propagation direction of the whistler wave in said chamber;
said coil further operable to inductively couple RF power to the whistler wave to excite the whistler wave and to transfer a sufficient amount of energy to the process gases in said chamber to induce a plasma state in the process gases.

2. The plasma source of claim 1, wherein said coil is further operable to resonantly inductive couple the RF power to the whistler wave to excite the whistler wave.

3. The plasma source of claim 1, wherein said coil is located inside of said chamber and positioned substantially parallel to sidewalls of said chamber.

4. The plasma source of claim 1, wherein said coil further comprises:
   a first coil routed outside said chamber along a bottom of said chamber; and
   a plurality of coils located outside of said chamber and substantially parallel to sidewalls of said chamber, said plurality of coils located between said electromagnets and said chamber.

5. The plasma source of claim 1, wherein said RF power is selected to be at a frequency between the ion and electron cyclotron frequencies of the process gases, the ion and electron cyclotron frequencies being less than the electron plasma frequency of the process gases.

6. The plasma source of claim 1, wherein said coil is operable to provide antennas of varying lengths for resonant inductive coupling of the RF power to the whistler wave over a range of conditions impacting the resonant inductive coupling of the RF power to the whistler wave, said coil further operable to generate time-varying magnetic fields which sustain the plasma state of the process gases.

7. The plasma source of claim 1, further comprising a plurality of permanent multipolar magnets located outside of said chamber, said magnets operable to establish a magnetic field along the surface of said chamber for confining the plasma.

8. The plasma source of claim 1, wherein said coil further comprises a passage for circulating coolant through said coil so as to cool said coil.

9. The plasma source of claim 1, wherein said coil is segmented with capacitors placed between adjacent coils operable to reduce the impedance of said coil.

10. A chamber operable for performing a plasma based process, the chamber containing process gases and securing a semiconductor wafer relative to a plasma source, comprising:
    a plurality of permanent multipolar magnets located outside of the chamber, said magnets operable to establish a magnetic field along the surface of the chamber for confining a plasma;
    a coil operable to generate a whistler wave in the chamber;
    a set of electromagnets located outside of the chamber, said electromagnets operable to define a preferred propagation direction of the whistler wave in the chamber; and
    said coil further operable to inductively couple RF power to the whistler wave to excite the whistler wave and transfer a sufficient amount of energy to the process gases to induce a plasma state in the process gases.

11. A method of inducing a plasma state in process gases in a chamber, comprising the steps of:
    generating a whistler wave with a coil, said coil including a first coil outside the chamber and along a bottom of the chamber, and a plurality of coils outside the chamber and along and substantially parallel to sidewalls of the chamber;
    generating a variable static electromagnetic field defining a preferred propagation direction of the whistler wave in the chamber; and
    exciting the whistler wave by inductively coupling RF power to the whistler wave with the coil, the excited wave transferring sufficient energy to the process gases to induce the plasma state in the process gases.

12. The method of claim 11, further comprising the step of generating time-varying electromagnetic fields with the coil to sustain the plasma state in the process gases.

13. The method of claim 11, wherein said generating a variable static electromagnetic field step is accomplished with at least one of electromagnets located outside the chamber.

14. The method of claim 11, further comprising the step of generating a magnetic field along the surface of the chamber for confining the plasma.

15. The method of claim 11, wherein said exciting step is accomplished by resonant inductive coupling of the RF power to the whistler wave with the coil.

16. The method of claim 11, further comprising the steps of:
    selecting a frequency of the RF power to be between ion and electron cyclotron frequencies of the process gases; and
    selecting the ion and electron cyclotron frequencies to be less than an electron plasma frequency of the process gases.

17. The method of claim 11, further comprising the steps of locating a plurality of coils inside the chamber and substantially parallel to sidewalls of the chamber, and connecting the plurality of coils with a connector coil traversing a vertical axis of the chamber.

18. The method of claim 11, wherein said exciting the wave step further comprises the coil providing antennas of varying lengths for resonant inductive coupling the RF power to the whistler wave over a range of conditions.

19. A plasma source for generating a plasma, comprising:
    a chamber operable to confine the plasma and process gases;
    a coil operable to generate a whistler wave in said chamber, said coil including;
        a first coil routed outside said chamber along a bottom of said chamber; and
        a plurality of coils located outside of said chamber and substantially parallel to sidewalls of said chamber, said plurality of coils located between said electromagnets and said chamber;
    at least one set of electromagnets located outside of said chamber, said electromagnets operable to define a preferred propagation direction of the whistler wave in said chamber;
    said coil further operable to inductively couple RF power to the whistler wave to excite the whistler wave and to transfer a sufficient amount of energy to the process gases in said chamber to induce a plasma state in the process gases.

20. The plasma source of claim 19 wherein said coil is further operable to resonantly inductive couple the RF power to the whistler wave to excite the whistler wave.

21. The plasma source of claim 19 wherein said coil includes a plurality of coils located inside of said chamber and positioned substantially parallel to sidewalls of said chamber, said plurality of coils shaped to match the contour of said chamber and connected by a connecting coil traversing a vertical axis of said chamber.

22. The plasma source of claim 19 wherein said RF power is selected to be at a frequency between the ion and electron cyclotron frequencies of the process gases, the ion and electron cyclotron frequencies being less than the electron plasma frequency of the process gases.

23. The plasma source of claim 19 wherein said coil is operable to provide antennas of varying lengths for resonant inductive coupling of the RF power to the whistler wave over a range of conditions impacting the resonant inductive coupling of the RF power to the whistler wave, said coil further operable to generate time-varying magnetic fields which sustain the plasma state of the process gases.

24. The plasma source of claim 19 further comprising a plurality of permanent multipolar magnets located outside of said chamber, said magnets operable to establish a magnetic field along the surface of said chamber for confining the plasma.

25. The plasma source of claim 19 wherein said coil further comprises a passage for circulating coolant through said coil so as to cool said coil.

26. The plasma source of claim 19 wherein said coil is segmented with capacitors placed between adjacent coils operable to reduce the impedance of said coil.

27. A plasma source for generating a plasma, comprising:
- a chamber operable to confine the plasma and process gases;
- a coil operable to generate a whistler wave in said chamber;
- at least one set of electromagnets located outside of said chamber, said electromagnets operable to define a preferred propagation direction of the whistler wave in said chamber;
- a plurality of permanent multipolar magnets located outside of said chamber, said magnets operable to establish a magnetic field along the surface of said chamber for confining the plasma.
- said coil further operable to inductively couple RF power to the whistler wave to excite the whistler wave and to transfer a sufficient amount of energy to the process gases in said chamber to induce a plasma state in the process gases.

28. The plasma source of claim 27 wherein said coil is further operable to resonantly inductive couple the RF power to the whistler wave to excite the whistler wave.

29. The plasma source of claim 27 wherein said coil is located inside of said chamber and positioned substantially parallel to sidewalls of said chamber.

30. The plasma source of claim 27 wherein said coil comprises a plurality of coils located inside of said chamber and positioned substantially parallel to sidewalls of said chamber, said plurality of coils shaped to match the contour of said chamber and connected by a connecting coil traversing a vertical axis of said chamber.

31. The plasma source of claim 27 wherein said coil further comprises:
- a first coil routed outside said chamber along a bottom of said chamber; and
- a plurality of coils located outside of said chamber and substantially parallel to sidewalls of said chamber, said plurality of coils located between said electromagnets and said chamber.

32. The plasma source of claim 27 wherein said RF power is selected to be at a frequency between the ion and electron cyclotron frequencies of the process gases, the ion and electron cyclotron frequencies being less than the electron plasma frequency of the process gases.

33. The plasma source of claim 27 wherein said coil is operable to provide antennas of varying lengths for resonant inductive coupling of the RF power to the whistler wave over a range of conditions impacting the resonant inductive coupling of the RF power to the whistler wave, said coil further operable to generate time-varying magnetic fields which sustain the plasma state of the process gases.

34. The plasma source of claim 27 wherein said coil further comprises a passage for circulating coolant through said coil so as to cool said coil.

35. The plasma source of claim 27 wherein said coil is segmented with capacitors placed between adjacent coils operable to reduce the impedance of said coil.

36. A plasma source for generating a plasma, comprising:
- a chamber operable to confine the plasma and process gases;
- a coil operable to generate a whistler wave in said chamber, said coil being segmented with capacitors placed between adjacent coils operable to reduce the impedance of said coil;
- at least one set of electromagnets located outside of said chamber, said electromagnets operable to define a preferred propagation direction of the whistler wave in said chamber;
- said coil further operable to inductively couple RF power to the whistler wave to excite the whistler wave and to transfer a sufficient amount of energy to the process gases in said chamber to induce a plasma state in the process gases.

37. The plasma source of claim 36 wherein said coil is further operable to resonantly inductive couple the RF power to the whistler wave to excite the whistler wave.

38. The plasma source of claim 36 wherein said coil is located inside of said chamber and positioned substantially parallel to sidewalls of said chamber.

39. The plasma source of claim 36 wherein said coil comprises a plurality of coils located inside of said chamber and positioned substantially parallel to sidewalls of said chamber, said plurality of coils shaped to match the contour of said chamber and connected by a connecting coil traversing a vertical axis of said chamber.

40. The plasma source of claim 36 wherein said coil further comprises:
- a first coil routed outside said chamber along a bottom of said chamber; and
- a plurality of coils located outside of said chamber and substantially parallel to sidewalls of said chamber, said plurality of coils located between said electromagnets and said chamber.

41. The plasma source of claim 36 wherein said RF power is selected to be at a frequency between the ion and electron cyclotron frequencies of the process gases, the ion and electron cyclotron frequencies being less than the electron plasma frequency of the process gases.

42. The plasma source of claim 36 wherein said coil is operable to provide antennas of varying lengths for resonant inductive coupling of the RF power to the whistler wave over a range of conditions impacting the resonant inductive coupling of the RF power to the whistler wave, said coil further operable to generate time-varying magnetic fields which sustain the plasma state of the process gases.

43. The plasma source of claim 36 further comprising a plurality of permanent multipolar magnets located outside of said chamber, said magnets operable to establish a magnetic field along the surface of said chamber for confining the plasma.

44. The plasma source of claim 36 wherein said coil further comprises a passage for circulating coolant through said coil so as to cool said coil.

45. A method of inducing a plasma state in process gases in a chamber, comprising the steps of:

generating a whistler wave with a coil, said coil including a plurality of coils located inside the chamber and located substantially parallel to sidewalls of the chamber;

connecting the plurality of coils with a connector coil traversing a vertical axis of the chamber;

generating a variable static electromagnetic field defining a preferred propagation direction of the whistler wave in the chamber; and exciting the whistler wave by inductively coupling RF power to the whistler wave with the coil, the excited wave transferring sufficient energy to the process gases to induce the plasma state in the process gases.

46. The method of claim 45 further comprising the step of generating time-varying electromagnetic fields with the coil to sustain the plasma state in the process gases.

47. The method of claim 45 wherein said generating a variable static electromagnetic field step is accomplished with at least one set of electromagnets located outside the chamber.

48. The method of claim 45 further comprising the step of generating a magnetic field along the surface of the chamber for confining the plasma.

49. The method of claim 45 wherein said exciting step is accomplished by resonant inductive coupling of the RF power to the whistler wave with the coil.

50. The method of claim 45 further comprising the steps of:

selecting a frequency of the RF power to be between ion and electron cyclotron frequencies of the process gases; and selecting the ion and electron cyclotron frequencies to be less than an electron plasma frequency of the process gases.

51. The method of claim 45 further comprising the step of locating a first coil outside the chamber and along a bottom of the chamber, and a plurality of coils outside the chamber and along and substantially parallel to sidewalls of the chamber.

52. The method of claim 45 wherein said exciting the wave step further comprises the coil providing antennas of varying lengths for resonant inductive coupling the RF power to the whistler wave over a range of conditions impacting the resonant inductive coupling of the RF power to the whistler wave.

* * * * *